(12) United States Patent
Stepanovic

(10) Patent No.: US 8,872,691 B1
(45) Date of Patent: Oct. 28, 2014

(54) METASTABILITY DETECTION AND CORRECTION IN ANALOG TO DIGITAL CONVERTER

(71) Applicant: Agilent Technologies, Inc., Loveland, CO (US)

(72) Inventor: Dusan Stepanovic, Mountain View, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 13/886,608

(22) Filed: May 3, 2013

(51) Int. Cl.
H03M 1/34 (2006.01)
(52) U.S. Cl.
CPC ........................................ *H03M 1/34* (2013.01)
USPC ............ 341/158; 341/144; 341/150; 341/160
(58) Field of Classification Search
CPC ......... H03M 1/34; H03M 1/56; H03M 1/123; H03M 1/468; H03M 1/1245; H04N 5/378; H04N 5/37455; H03K 5/24
USPC .................................................. 341/122–160
See application file for complete search history.

(56) References Cited

U.S. PATENT DOCUMENTS

| | | | | |
|---|---|---|---|---|
| 5,028,926 | A * | 7/1991 | Tokuhiro | 341/161 |
| 5,982,311 | A * | 11/1999 | Belin | 341/118 |
| 6,603,415 | B1 | 8/2003 | Somayajula | |
| 6,617,899 | B2 | 9/2003 | Cyrusian | |
| 8,193,957 | B2 * | 6/2012 | Yoshioka | 341/118 |
| 8,362,940 | B2 * | 1/2013 | Yoshioka | 341/155 |
| 8,462,038 | B2 * | 6/2013 | Furuta | 341/162 |
| 8,659,463 | B2 * | 2/2014 | Cho et al. | 341/155 |
| 2012/0133535 | A1 | 5/2012 | Verbruggen | |

OTHER PUBLICATIONS

Shikata, et al. "A 0.5 V 1.1 MS/sec 6.3 fJ/Conversion-Step SAR-ADC With Tri-Level Comparator in 40 nm CMOS", IEEE Journal of Solid-State Circuits, vol. 47, No. 4, Apr. 2012.

Jiang, et al. "Single-Channel, 125-GS/s, 6-bit, Loop-Unrolled Asynchronous SAR-ADC in 40 nm-CMOS", EEE Journal of Solid-State Circuits, vol. 47, No. 10, Oct. 2012.

\* cited by examiner

*Primary Examiner* — Lam T Mai

(57) ABSTRACT

A method of operating an analog to digital converter (ADC) comprises comparing an analog input signal to a reference signal, using a comparator, and generating a comparator output according to the comparison, storing the comparator output in at least one memory unit, monitoring the stored comparator output to determine whether a difference between the analog input signal and the reference signal is within a predetermined range, and detecting a metastability error upon determining that the difference between the analog input signal and the reference signal is within a predetermined range.

20 Claims, 10 Drawing Sheets

METASTABILITY DETECTION AND CORRECTION IN ANALOG TO DIGITAL CONVERTER

BACKGROUND

An analog-to-digital converter (ADC) is a device that converts an analog input signal into a corresponding digital output signal. Typically, this conversion is performed by comparing the analog input signal to one or more reference voltages using one or more comparators. The results of these comparisons are then stored in memory units, such as latches or flip-flops. In most applications, the sampling of the input signal is performed at regular time intervals to generate a sequence of digital values representing the analog input signal.

FIG. 1 is a block diagram illustrating a simplified example of a one-bit ADC 100. In this example, the analog input signal is converted into one-bit digital samples at regular intervals defined by a clock signal.

Referring to FIG. 1, ADC 100 comprises a comparator 105 and a latch 110. Comparator 105 receives analog input signal $V_{in}$ and compares it to a reference voltages $V_{ref}$. In some implementations, where analog input signal $V_{in}$ is greater than or equal to reference voltage $V_{ref}$ comparator 105 outputs a "1", and where analog input signal $V_{in}$ is less than reference voltage $V_{ref}$, comparator 105 outputs a "0". Latch 110 stores the output of comparator 105 and outputs the stored value as a digital sample $d_0$. The output of comparator 105 is updated according to a clock signal clk.

In general, the bit resolution of ADC 100 can be increased by performing additional comparisons between analog input signal $V_{in}$ and other reference voltages and storing the results of the comparisons in additional latches. The additional comparisons can be performed in parallel using additional comparators, or they can be performed sequentially using the same or additional comparators. A simplified example of a multi-bit ADC that performs comparisons in sequence is described below with reference to FIG. 2.

FIG. 2 is a block diagram illustrating a simplified example of a successive approximation register (SAR) ADC 200. In this example, analog input signal $V_{in}$ is converted into (n+1)-bit digital samples by performing "n+1" voltage comparisons at regular intervals defined by a clock signal clk.

Referring to FIG. 2, ADC 200 comprises a comparator 205, a SAR 210, and a digital to analog converter (DAC) 215. Comparator 205 receives analog input signal $V_{in}$ and compares it to a reference signal $V_{ref}$ output by DAC 215. Where analog input signal $V_{in}$ is greater than or equal to reference voltage $V_{ref}$ comparator 205 outputs a "1", and where analog input signal $V_{in}$ is less than reference voltage $V_{ref}$, comparator 205 outputs a "0". SAR 210 stores and outputs data $d_0, d_1, \ldots, d_n$ using a corresponding plurality of latches, and it updates this data based on the output of comparator 205. For explanation purposes, it will be assumed that data $d_0$ represents a most significant bit of a digital sample, data $d_n$ represents a least significant bit, and so on. DAC 215 converts the data $d_0, d_1, \ldots, d_n$ into reference voltage $V_{ref}$ so reference voltage $V_{ref}$ is updated with data $d_0, d_1, \ldots, d_n$. The updating of data $d_0, d_1, \ldots, d_n$ and reference voltage $V_{ref}$ are performed according to clock signal clk, which controls the updating of the output of comparator 205.

During conventional switching operation of ADC 200, which is merely one of several potential implementations of an SAR ADC, data $d_0, d_1, \ldots, d_n$ is updated by an iterative procedure in which comparator 205 performs successive comparisons between analog input signal $V_{in}$ and reference voltage $V_{ref}$ according to clock signal clk. In the iterative procedure, data $d_0, d_1, \ldots, d_n$ is initialized so that all bits are "0". At the beginning of each iteration, data $d_i$ is selected for updating, with "i" set to zero in the first iteration. Data $d_i$ is changed to "1" and DAC 215 generates reference voltage $V_{ref}$ with a magnitude corresponding to data $d_0, d_1, \ldots, d_n$. For instance, where n=3, a first iteration changes data $d_0, d_1, \ldots, d_n$ to "1000" and DAC 215 generates reference voltage $V_{ref}$ with a magnitude corresponding to "1000". If analog input signal $V_{in}$ is greater than or equal to reference voltage $V_{ref}$, the value of data $d_i$ remains at "1". Otherwise, it is changed to "0". Next, the procedure determines whether all bits of data $d_0, d_1, \ldots, d_n$ have been updated. If so, data $d_0, d_1, \ldots, d_n$ is fetched from the latches of SAR 210. Otherwise, "i" is incremented and a next iteration is performed.

In the above and other ADCs, the time needed to compare two analog voltages and store a resulting binary output value in a latch may depend on a difference between the two input voltages. The smaller the difference, the longer it takes for the output value to be generated and stored. A longer delay can potentially lead to metastability errors, causing the ADC to output erroneous results. For instance, in ADC 200 of FIG. 2, if the analog input signal $V_{in}$ is relatively close to the initial value of reference voltage $V_{ref}$ a relatively long time may be required to update data $d_0$. If this time is longer than the period of clock signal clk, data $d_0$ will not be properly updated until a next comparison is performed, which can lead to a metastability error. An example of such a metastability error is described below with reference to FIGS. 3A and 3B.

FIG. 3A is a circuit diagram illustrating an example of a 4-bit SAR ADC 300. ADC 300 represents one possible implementation of ADC 200 of FIG. 2. FIG. 3B is a timing diagram illustrating the operation of ADC 300 and the generation of a metastability error during the operation.

Referring to FIGS. 3A and 3B, ADC 300 comprises substantially the same features as ADC 200, except that SAR 210 is implemented by a combination of a demultiplexer (DMUX) and a plurality of latches corresponding to data $d_0, d_1, d_2, d_3$, respectively. The DMUX operates responsive to a two bit control signal CTRL[0:1] to transfer the output of comparator 205 to one of four latches in the form of one of DMUX output signals $D_0, D_1, D_2, D_3$. For explanation purposes, it is assumed that analog input signal $V_{in}$ has a magnitude corresponding to a digital value "0111", as illustrated by a dotted horizontal line in FIG. 3B.

ADC 300 converts the analog input signal $V_{in}$ into 4-bit data $d_0, d_1, d_2, d_3$ by performing four sequential comparisons every 1 ns at times t=0 ns, 1 ns, 2 ns, 3 ns, and the result is fetched at t=4 ns. Because analog input signal $V_{in}$ has a value that is relatively close to the initial value of reference voltage $V_{ref}$, a first comparison and storing can take more than 1 ns. In the example of FIG. 3B, it takes 2.5 ns. After 1 ns, ADC 300 stores data $d_0$ as "1", so a second comparison produces a "0". After 2 ns, ADC 300 stores data [$d_0, d_1$] as "10", so a third comparison produces a "0". After 2.5 ns, the result of the first comparison is finally written to the corresponding latch, so ADC 300 stores data $d_0$ as "0" at that time, as indicated by a dotted circle. After 3 ns, ADC 300 performs a fourth comparison, producing a "1". A final result is "0001" instead of "0111", which means the error magnitude is "0110", which is almost a half-scale error for a 4-bit ADC. In other words, as illustrated by this example, metastability errors can produce relatively large conversion errors in an ADC.

In general, an ADC can be designed with reduced probability of metastability errors if the required conversion speed is relatively low. For instance, an ADC can be designed so that metastability errors occur with probability of $10^{-8}$. In measurement instrumentation applications, such as real-time oscilloscopes, however, the required metastability error rate may be extremely low (e.g., $10^{-20}$), and the required sampling speed may be extremely high (e.g., 10's or 100's GS/s). In these circumstances, the metastability error rate can be reduced by interleaving "M" ADCs, each operating at lower sampling speed ($f_s/M$), but this can lead to an unacceptably large interleaving factor M. Moreover, some ADC architectures are more prone to metastability errors than others, i.e., errors occur more frequently for a given sampling speed. This is one reason why, for example, pipeline ADCs have been a preferred choice over an SAR ADCs, despite a generally superior power efficiency of SAR ADCs. This is also a reason why, for instance, asynchronous SAR ADCs have been faster than synchronous SAR ADCs, as there is no need to allot a large number of time constants to a comparator in an asynchronous SAR.

In view of the above and other shortcomings of conventional ADCs, there is a general need for ADCs having improved metastability detection and correction mechanisms.

SUMMARY

In a representative embodiment, a method of operating an ADC comprises comparing an analog input signal to a reference signal, using a comparator, and generating a comparator output according to the comparison, storing the comparator output in at least one memory unit, monitoring the stored comparator output to determine whether a difference between the analog input signal and the reference signal is within a predetermined range, and detecting a metastability error upon determining that the difference between the analog input signal and the reference signal is within a predetermined range.

In certain related embodiments, monitoring the stored comparator output comprises sampling the stored comparator output at a first time and a second time to generate respective first and second samples of the stored comparator output, and comparing the first and second samples to each other to determine whether the stored comparator output changed between the first time and the second time. In such embodiments, the metastability error may be detected upon determining that the first and second samples have different values. In addition, sampling the stored comparator output at the first time and the second time may comprise transferring the stored comparator output from the memory unit to a first flip-flop at the first time, and transferring the stored comparator output from the memory unit to a second flip-flop and from the first flip-flop to a third flip-flop, both at the second time, wherein the second time occurs at the end of a current ADC sampling period In certain related embodiments, the method further comprises (a) sampling the stored comparator output at an i-th time to produce an n-th sample, and storing the n-th sample in a p-th memory unit, (b) sampling the stored comparator output at a j-th time after the i-th time to produce an m-th sample, and storing the m-th sample in a q-th memory unit, (c) sampling the p-th memory unit to produce an (n+1)-th sample, and storing the (n+1)-th sample in a (p+1)-th memory unit, (d) sampling the q-th memory unit to produce an (m+1)-th sample, and storing the (m+1)-th sample in a (q+1)-th memory unit, and (e) comparing the (n+1)-th sample to the (m+1)-th sample and detecting the metastability error based on the comparison. The operations (c) and (d) may be repeated at least one time with increased values of i n, n, p, and q in each repetition, prior to performing (e) with the increased values of m and n.

In certain related embodiments, storing the comparator output in at least one memory unit comprises storing the comparator output in a first memory unit and a complementary value of the comparator output in a second memory unit, and monitoring the stored comparator output to determine whether a difference between the analog input signal and the reference signal is within the predetermined range comprises sampling the first and second memory units storing the comparator output to produce first and second samples, and comparing the first and second samples. In such embodiments, the metastability error may be detected upon determining that the first and second samples have the same value.

In another representative embodiment, an ADC comprises a comparator configured to compare an analog input signal to a reference signal to produce a comparator output, a storage unit comprising at least one memory unit configured to store the comparison result, a monitoring unit configured to monitor the stored comparator output to determine whether a difference between the analog input signal and the reference signal is within a predetermined range, and an error detection unit configured to detect a metastability error upon determining that the difference between the analog input signal and the reference signal is within a predetermined range.

In certain related embodiments, the monitoring unit monitors the stored comparator output by sampling the stored comparator output at a first time and a second time to generate respective first and second samples of the stored comparator output, and comparing the first and second samples to each other to determine whether the stored comparator output changed between the first time and the second time. In such embodiments, the error detection unit may detect the metastability error as a consequence of the monitoring unit determining that the first and second samples have different values.

In certain embodiments, the storage unit stores the comparator output in a first memory unit and stores a complementary value of the comparison result in a second memory unit, and the monitoring unit samples the first and second memory units storing the comparator output to produce first and second samples, and compares the first and second samples. In such embodiments, the error detection unit detects the metastability error as a consequence of the monitoring unit determining that the first and second samples have the same value.

In certain related embodiments, the ADC further comprises a correction unit configured to correct the metastability error by generating a digital output signal representing the analog input signal, wherein the digital output signal comprises stored comparison results obtained before the metastability error was detected followed by multiple bits with values determined by the detection of the metastability.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

Figure 1:
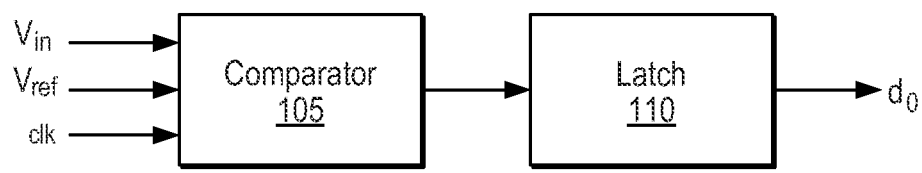
FIG. 1 is a block diagram illustrating a simplified example of a one-bit ADC.
Figure 2:
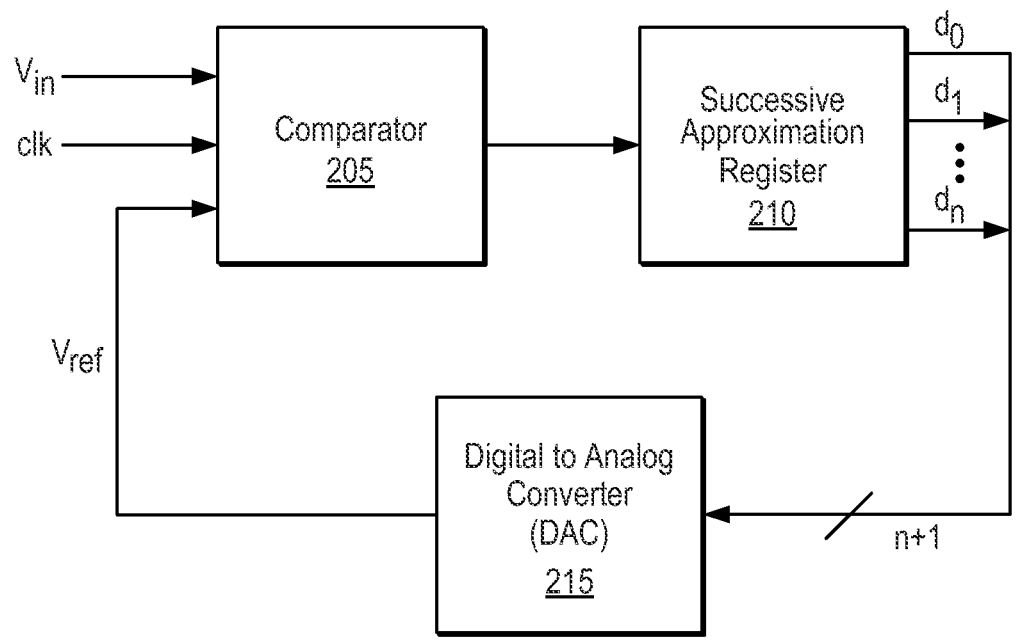
FIG. 2 is a block diagram illustrating a simplified example of an SAR ADC.
Figure 3A:
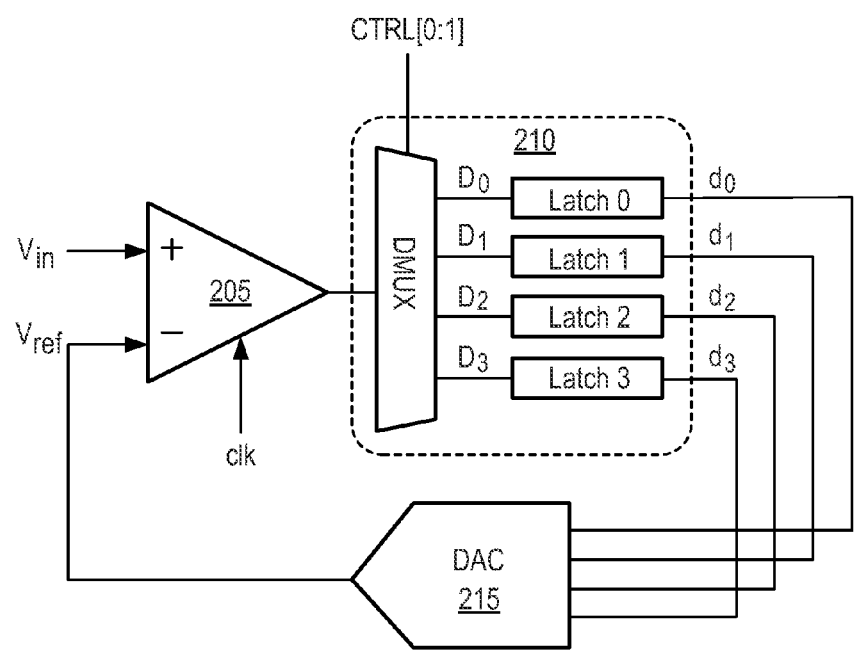
FIG. 3A is a circuit diagram illustrating an example of a 4-bit SAR ADC.
Figure 3B:
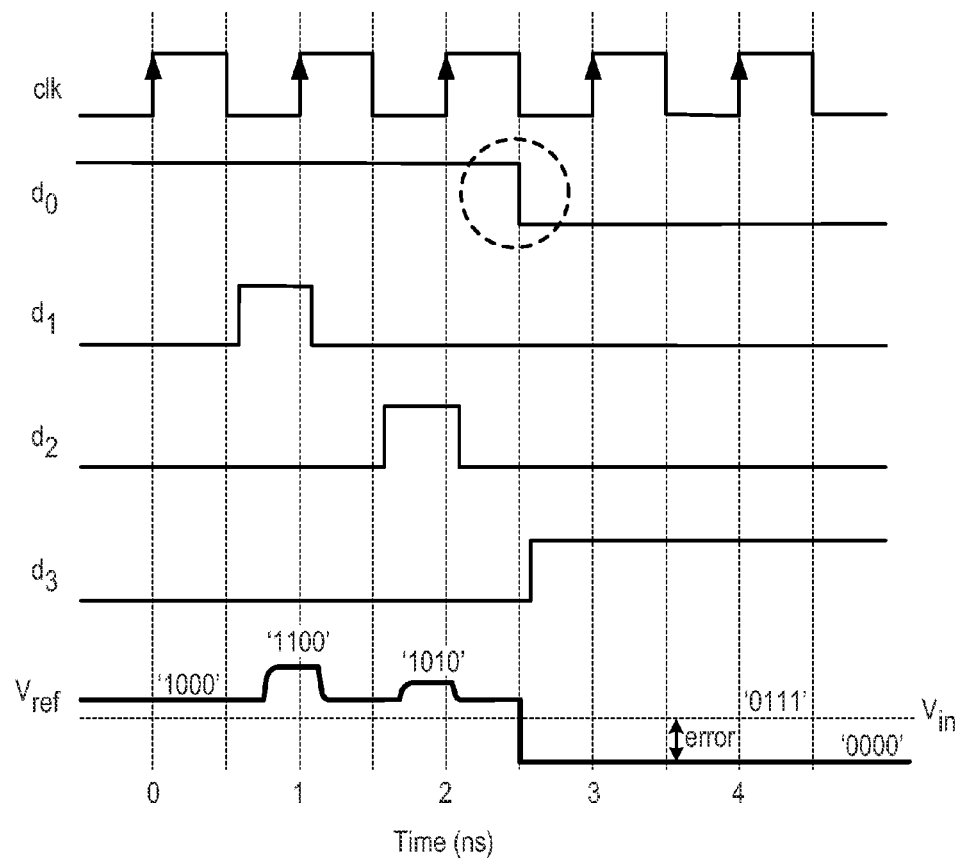
FIG. 3B is a timing diagram illustrating the operation of the ADC of FIG. 3A and the generation of a metastability error during the operation.
Figure 7:
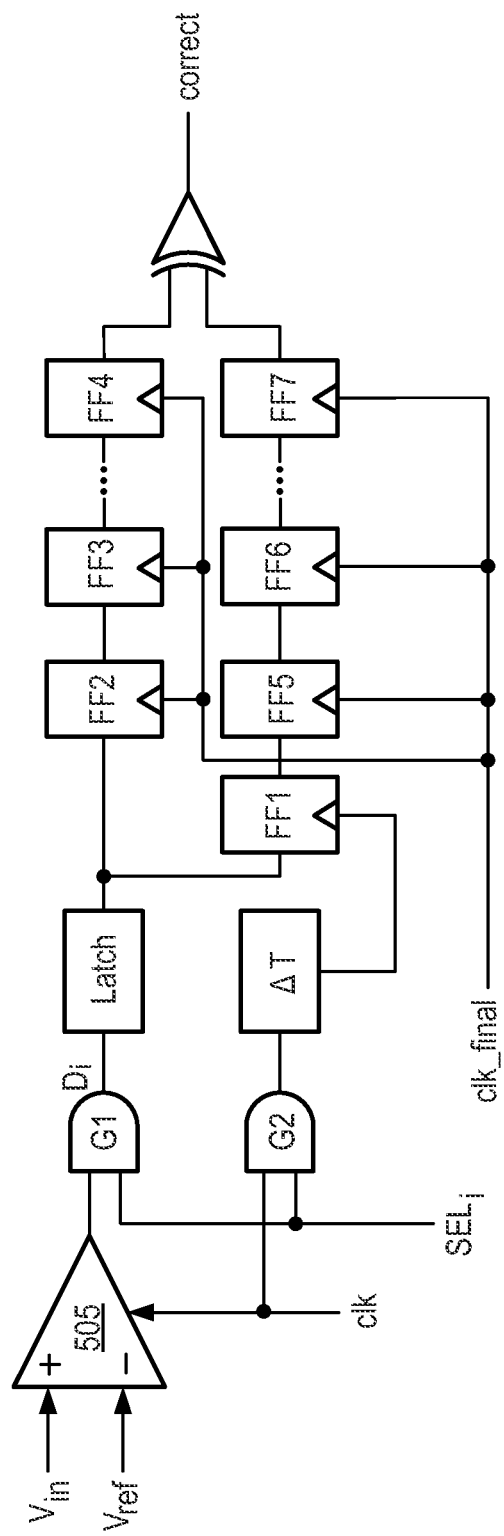
FIG. 7 is a circuit diagram illustrating a portion of an ADC comprising a metastability detector according to a representative embodiment.

The described embodiments relate generally to techniques and technologies that can be used to detect and/or correct metastability errors in an ADC. As illustrated by the example of FIGS. 3A and 3B, a metastability error can occur where a comparison and the storage of resulting data takes longer than expected. The comparison is typically slow where a difference between comparator inputs is relatively small. Consequently, a metastability error can be detected and corrected by identifying a comparison in the conversion process that was slower than expected, keeping all comparison results obtained before the metastability occurred, and forcing remaining bits to 100 . . . 0. In a synchronous SAR ADC, this can be achieved by sampling values of latches used to store a comparator output at two different times: at a first time where the decision is expected to be completed (i.e., before a change in the latch value would cause an error in the conversion), and at second time after the conversion process is completed. The two sampled values are compared, and if they are different, a metastability error is detected and output data can be determined based on the bit-position at which the metastability error occurred. This sampling can be performed by flip-flops clocked by appropriately delayed clocks, as illustrated in FIG. 7, for example. In addition, because flip-flops are also regenerative circuits, and may suffer from the metastability problem as well, the values of the flip-flops can be further resampled certain number of times to arbitrarily reduce the probability of failing to detect a metastability error. The resampling gives more time for positive-feedback circuits inside the flip-flops to regenerate. This resampling may introduce additional delay time, but such a delay may be within a range that can be tolerated by many applications, such as measurement instruments.

Figure 9:
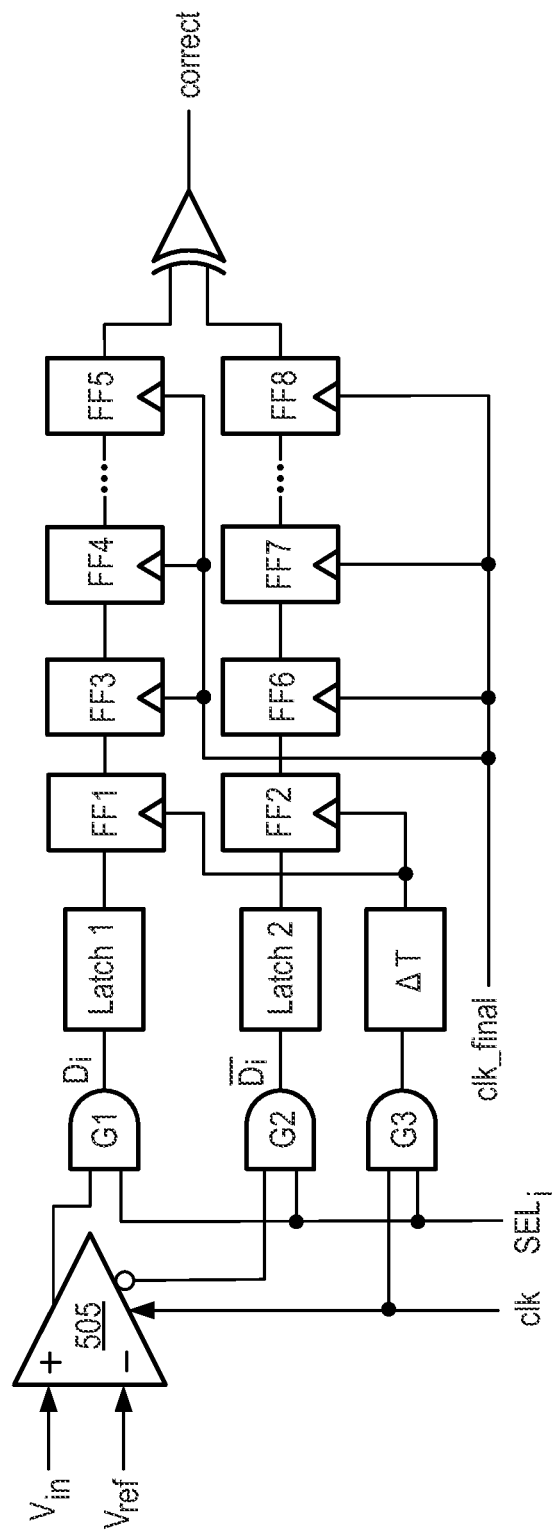
FIG. 9 is a circuit diagram illustrating a portion of an ADC comprising a metastability detector according to a representative embodiment.

In some SAR ADC architectures, both a comparator output and its complementary value are stored in latches. Typically, the latches are both initialized to the same value, and then one of them is flipped. In this situation, a metastability error can be detected by sampling the values of both latches at a certain time after the comparator is strobed (i.e., before the change in the latch value would cause an error in the conversion), as illustrated in FIG. 9, for example. If the two sampled value are the same, the metastability error is detected. To further reduce the probability of metastable detector being metastable, the values sampled in the flip-flops can be further resampled.

In addition to providing improved accuracy, the use of metastability detection and correction as described herein may also allow an increase in the speed of synchronous SAR ADCs. For example, to achieve a metastability rate of $10^{-20}$ using conventional techniques, around 45 time constants may need to be allocated for comparator regeneration. However, if the metastability detection and correction are used, about 7 time constants may suffice. Moreover, although several embodiments are described below in relation to synchronous SAR ADCs, the described concepts can be generalized for any ADC architecture.

Figure 4:
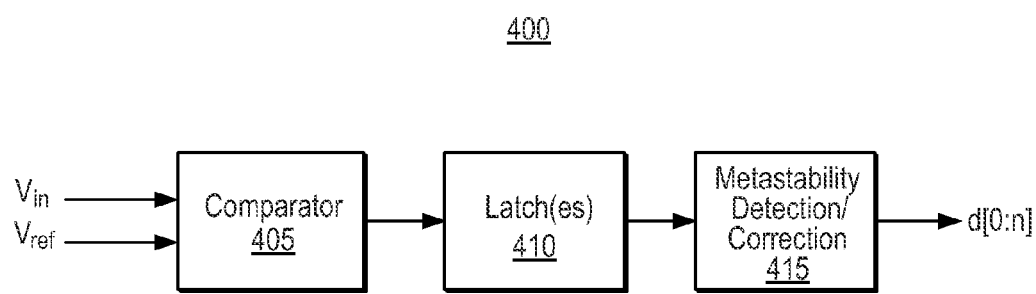
FIG. 4 is a block diagram of an ADC comprising a metastability detector according to a representative embodiment.

FIG. 4 is a block diagram of an ADC 400 comprising a metastability detector according to a representative embodiment.

Referring to FIG. 4, ADC 400 comprises a comparator 405, at least one latch 410, and a metastability detection/correction unit 415. ADC 400 is configured to convert an analog input signal $V_{in}$ into an (n+1)-bit digital output signal d[0:n].

During typical operation of ADC 400, comparator 405 receives analog input signal $V_{in}$ and at least one reference voltage $V_{ref}$. It compares analog input signal $V_{in}$ with the at least one reference voltage $V_{ref}$ and produces a comparator output according to a difference between the analog input signal $V_{in}$ and the at least one reference voltage $V_{ref}$. In general, the comparator output may comprise one or more signals. For instance, some comparators may produce two signals that are complementary to each other. The timing of the comparator output may depend on the difference between the analog input signal $V_{in}$ and the at least one reference voltage $V_{ref}$. For instance, where the difference is relatively small, the comparator output may not reflect a result of the comparison until a relatively long time has elapsed. The at least one latch 410 receives and stores the comparator output, and metastability detection/correction unit 415 monitors data stored in the at least one latch 410 to determine whether the difference is within a predetermined (e.g., small) range. Thereafter, metastability detection/correction unit 415 detects a metastability error based on the monitoring of the data stored in the latch.

In certain embodiments, this monitoring is performed by sampling the latch at a first time and then at a subsequent second time to determine whether the stored data changes between those two times. The first time may correspond to a time when the stored comparator output is expected to be valid under normal operating conditions, and the second time may correspond to a time where the conversion of analog input signal $V_{in}$ to digital output signal d[0:n] is to be completed. A change in the latch data between the first and second times indicates that the comparator output required a relatively long time to be updated, which in turn indicates that the difference between analog input signal $V_{in}$ and the reference voltage $V_{ref}$ is relatively small. Accordingly, the change can be used to detect a metastability error. In certain other embodiments, the monitoring is performed by sampling first and second latches configured to store a value of the comparator output and a complement of the value of the comparator output, respectively, and then determining whether the respective values sampled from the two latches are the same. Where the sampled values are the same, it indicates that the comparator output has not been updated to reflect the difference between the analog input signal $V_{in}$ and the reference voltage $V_{ref}$, which in turn indicates that the difference between analog input signal $V_{in}$ and the reference voltage $V_{ref}$ is relatively small. Accordingly, the difference in values can be used to detect a metastability error. A number of potential implementations of the at least one latch 410 and metastability detection/correction unit 415 will become apparent from the description of FIGS. 6 through 10 below.

Figure 5:
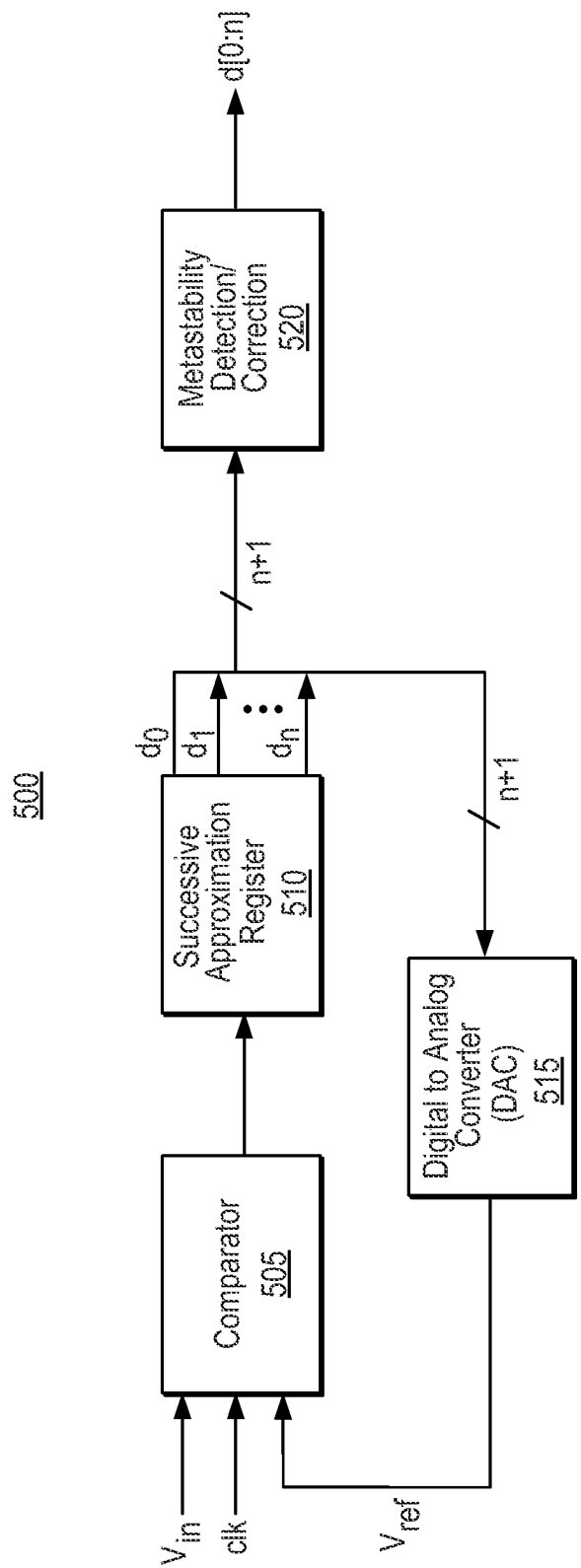
FIG. 5 is a block diagram of an ADC comprising a metastability detector according to another representative embodiment.

FIG. 5 is a block diagram of an ADC 500 comprising a metastability detector according to another representative embodiment.

Referring to FIG. 5, ADC 500 comprises a comparator 505, an SAR 510, a digital to analog converter 515, and a metastability detection/correction unit 520. ADC 500 is configured to convert an analog input signal $V_{in}$ into an (n+1)-bit digital output signal d[0:n].

ADC 500 functions similar to ADC 200 described above, except that metastability detection/correction unit 520 samples comparator outputs stored in latches of SAR 510 at different times to detect the presence of a metastability error, and it outputs a corrected digital output signal d[0:n] upon detecting the metastability error. In addition, ADC 500 performs comparisons in synchronization with a clock signal clk. The sampling can be performed at first and second times, similar to metastability detection/correction unit 420 of FIG. 4. A number of potential implementations of SAR 510 and metastability detection/correction unit 520 will become apparent from the description of FIGS. 6 through 10 below.

Figure 6:
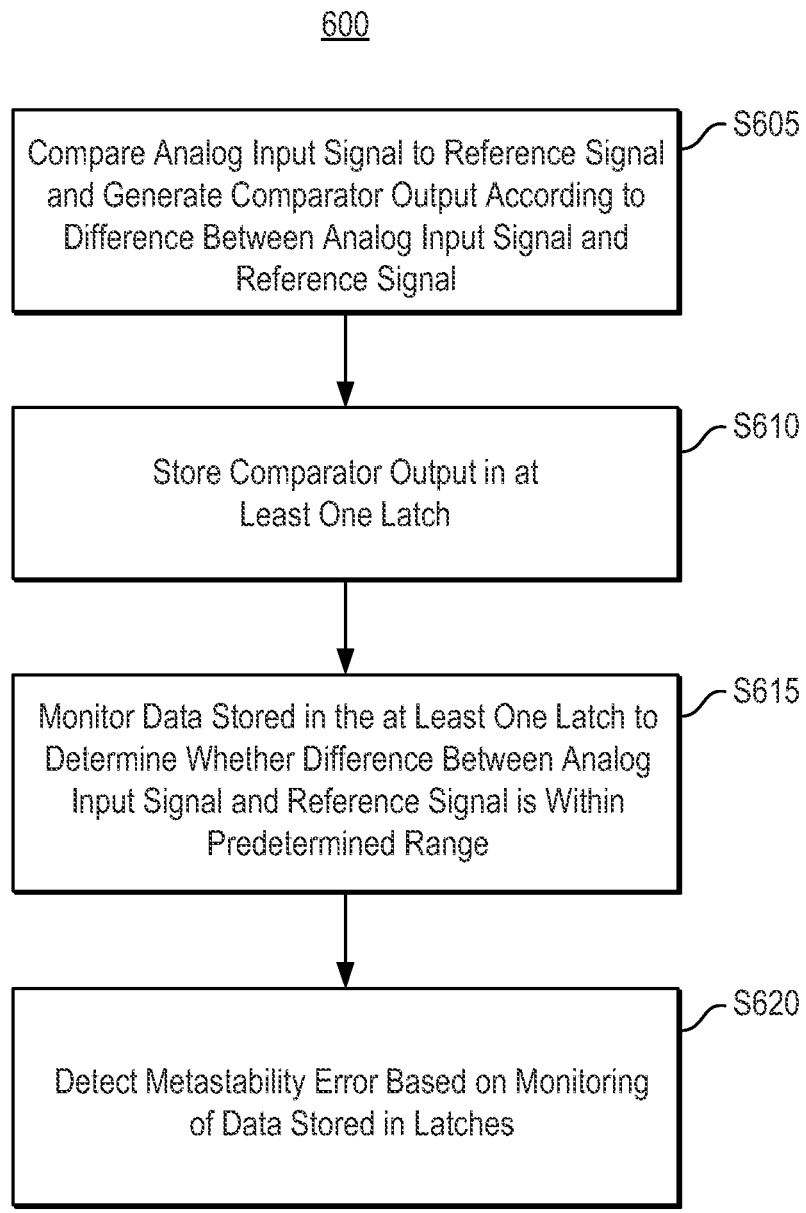
FIG. 6 is a flowchart illustrating a method of operating an ADC according to a representative embodiment.

FIG. 6 is a flowchart illustrating a method 600 of operating an ADC according to a representative embodiment. For explanation purposes, it will be assumed that the method of FIG. 6 is performed by ADC 500, although the method is not restricted to this or any other specific implementation. In the description that follows, example method features will be indicated by parentheses (SXXX) to distinguish them from example apparatus features.

Referring to FIG. 6, the method begins by comparing an analog input signal to a reference signal, using a comparator, and generating a comparator output according to a difference between the analog input signal and the reference signal (S605). This may comprise, for instance, a comparison between analog input signal $V_{in}$ and reference voltage $V_{ref}$ as in FIG. 5. The comparator typically has one or two outputs, with the two outputs typically corresponding to complementary values. Before the comparison is performed, the comparator is typically reset and corresponding latches for storing the comparator output are set to a default value (e.g., "1"). Then, the comparator is strobed to initiate the comparison. After the comparator is strobed, there is generally a delay before the comparator output will reflect a result of the comparison. As indicated above, the magnitude of the delay depends on the magnitude of the difference between the analog input signal and the reference signal. For example, where the difference is smaller, the delay may be relatively large.

Next, the method stores the comparator output in at least one memory unit, such as a latch (S610). For instance, a single bit may be stored in a single latch, or two bits may be stored in two latches. Next, the method monitors the at least one latch to determine whether the difference between the analog input signal and the reference signal is within a predetermined range (S615). The predetermined range is generally a small range that corresponds to a metastability error. The monitoring of the at least one latch can take different forms in different embodiments. For instance, as described below in relation to FIGS. 7 and 8, the monitoring may comprise sampling a single latch at two different times to determine whether the value of the comparator output stored in the latch changes between those times, indicating that the difference between the analog input signal and the reference signal is relatively small. Alternatively, as described below in relation to FIGS. 9 and 10, the monitoring may comprise sampling two latches to determine whether they have been updated to reflect the difference between the analog input signal and the reference signal. If not, it indicates that the difference between the analog input signal and the reference signal is relatively small. In addition, as described below, the sampled data can be resampled an arbitrary number of times to improve the accuracy of metastability error detection and correction. Finally, the method detects a metastability error based on the monitoring of the latch data (S620).

In an SAR ADC such as that illustrated in FIG. 5, operations S605 through S615 can be repeated for each of the different bit values of digital output signal d[0:n]. During the course of these repetitions, if a metastability error is detected, digital output signal d[0:n] can be generated by retaining all bit values determined prior to detection of the error, and setting the remaining bit values to a "1" followed by a string of trailing "0"s.

FIG. 7 is a circuit diagram illustrating a portion of an ADC comprising a metastability detection/correction unit according to a representative embodiment. For explanation purposes, and to provide an example context, it will be assumed that the portion shown in FIG. 7 forms part of ADC 500 shown in FIG. 5. In particular, it will be assumed that the portion comprises comparator 505, part of SAR 510, and part of metastability detection/correction unit 520. The illustrated parts function to process a single bit (e.g., a first bit $d_0$) of digital output signal d[0:n]. Other similar parts can be used to process other bits of the same digital output signal.

Referring to FIG. 7, comparator 505 performs a comparison between analog input signal $V_{in}$ and reference voltage $V_{ref}$ as described with reference to FIG. 5. Comparator 505 is first initialized, together with corresponding latches, as indicated above. Then it is strobed, or updated, at a time to determined by clock signal clk. A comparator output produced by comparator 505 is transmitted through a first logic gate G1 to a latch. The logic gate G1 is an AND gate and is operated as part of a DMUX, similar to the DMUX illustrated in FIG. 3A. In a 1:4 DMUX example, as in FIG. 3A, a DMUX control signal CTRL[0:1] has four different values to activate one of four different selection signals SEL[0:3]. Where a particular selection signal SEL is activated, it causes the comparator output to be converted to a DMUX output signal $D_i$. At the same time, a clock signal elk and selection signal $SEL_i$ are input to a second logic gate G2, which provides an output signal to a delay circuit ΔT.

An output of the latch is stored in a first flipflop FF1 at a first time $t_1$ defined by clock signal elk and a delay imposed by delay circuit ΔT. Thereafter, the output of the latch circuit is also stored in a second flipflop FF2 at a second time $t_2$ defined by a final clock clk_final. The period of the final clock clk_final corresponds to the time required to perform "n+1" comparisons in ADC 500 for the "n+1" bits of digital output signal d[0:n]. Accordingly, clock signal elk passes through "n+1" cycles for each cycle of final clock clk_final. Also at second time $t_2$, the stored output of the latch is transferred from first flipflop FF1 to a fifth flipflop FF5. The data stored in second flipflop FF2 and fifth flipflop FF5 is then transferred in synchronization through additional flipflops until the transferred data reaches an XOR gate.

Once the data reaches XOR gate, if it is the same in both of flipflops FF4 and FF7, it indicates that no metastability error has occurred with respect to the data. Accordingly, a correction signal assumes the value "0" to indicate that no metastability error correction is required. Otherwise, if the data is different in flipflops FF4 and FF7, it indicates that a metastability error has occurred with respect to the data. This generally means that the value stored in the latch changed between first time $t_1$ and second time $t_2$, or that the value stored in one of the flipflops changed between data transfer. Where a metastability error is present, the correction signal assumes the value "1" to indicate that metastability error correction is required. In general, the probability of failing to detect or correct a metastability error can be reduced arbitrarily by increasing the number of flipflops in each of the respective flipflop chains shown in FIG. 7.

In response to the correction signal assuming the value "1", metastability detection/correction unit 520 performs error correction by retaining all bit values of digital output signal d[0:n] that are more significant than the bit value where metastability occurred, and setting remaining bit values to a "1" followed by "0"s.

The conditions for detecting metastability, as described in relation to FIG. 7, can be formulated in an alternative manner, with certain generalizations, as follows. During each comparison, one output of comparator 505 is connected (through a demultiplexer) to the input of one latch. Before the comparison, comparator 505 is reset and the value of the latch is set to "1", although the use of "1" is just an example, and a different polarity can be used in other implementations. Where the latch is set to "1" before comparator 505 is strobed, the latch should be designed such that it does not allow false transitions at its output. This means that, in a response to the comparator output, the latch output can either stay at "1" or completely change its value to "0" (if the latch was initially reset to "0", it can only stay at '0' or completely change its state to "1"). Partial transitions, where the latch output goes from "1" to some voltage close to '0' and then goes back to "1", are not allowed. This can be achieved by embedding a simple skewed inverter inside the latch, for instance. After comparator 505 is strobed, three different scenarios may occur, depending on the difference between input signal $V_{in}$ and reference voltage $V_{ref}$, referred to hereafter as $V_{diff}$.

In a first scenario, $V_{diff}$ is less than or equal to some small voltage V1, where 0<V1<LSB. In this scenario, $V_{diff}$ is either negative or a very small positive voltage, so the output of comparator 505 stays at zero (where it was previously reset) or it produces a very small pulse that is not going to change the value stored in the latch. Therefore, a "1" will be sampled both at the first time and the second time. Because both samples are equal, no metastability is detected and the value stored in the latch is "1".

In a second scenario, $V_{diff}$ is between V1 and V2, where V1<V2<LSB. In this scenario, comparator 505 produces a narrow pulse at its output that is going to reset the value of the latch, but the latch will be reset after the first time its value is sampled. Therefore, the first sample will be a "1" and the second sample will be a "0". Consequently, metastability is detected.

In a third scenario, $V_{diff}$ is greater than or equal to V2. In this scenario, the output of comparator 505 is a wide pulse that will quickly reset the value of the latch. Therefore, by the time the latch is sampled the first time, it will already be a "0". The second sample is also a "0" and no metastability is detected. The value in the latch is "0".

As indicated by the description of the above three scenarios, where $V_{diff}$ is such that 0<V1<$V_{diff}$<V2<LSB, metastability is detected and a correction mechanism is activated.

Figure 8:
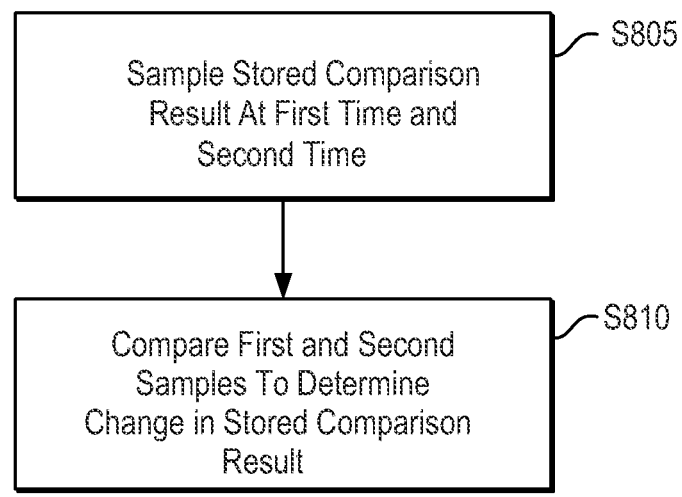
FIG. 8 is a flowchart illustrating a method of operating the ADC of FIG. 7 according to a representative embodiment.

FIG. 8 is a flowchart illustrating a method of operating an ADC comprising the portion illustrated in FIG. 7 according to a representative embodiment. As indicated by the labeling in FIG. 8, this method represents one possible implementation of operation 615 of FIG. 6.

Referring to FIG. 8, the method comprises sampling the stored comparator output at a first time and a second time to generate respective first and second samples of the stored comparator output (S805) and comparing the first and second samples to each other to determine whether the stored comparator output changed between the first time and the second time (S810). These operations can be performed by operation of the flipflops and the XOR gate as illustrated in FIG. 7. Thereafter, a metastability error is detected upon determining that the stored comparator output changed between the first time and the second time.

FIG. 9 is a circuit diagram illustrating a portion of an ADC comprising a metastability detector according to a representative embodiment. For explanation purposes, and to provide an example context, it will be assumed that the portion shown in FIG. 9 forms part of ADC 500 shown in FIG. 5. In particular, it will be assumed that the portion comprises comparator 505, part of SAR 510, and part of metastability detection/correction unit 520. The illustrated parts function to process a single bit (e.g., a first bit $d_0$) of digital output signal d[0:n]. Other similar parts can be used to process other bits of the same digital output signal.

Referring to FIG. 9, first and second latches "Latch 1" and "Latch 2" are initialized or reset to the same value (e.g., "1"), and comparator 505 is reset so that it outputs a predetermined value (e.g., "0"). Then, comparator 505 performs a comparison between analog input signal $V_{in}$ and reference voltage $V_{ref}$, as described with reference to FIG. 5. Comparator 505 is strobed, or updated, at a time to determined by clock signal elk. A comparator output produced by comparator 505 is transmitted through a first logic gate G1 to first latch "Latch 1", and a complement of the comparator output is transmitted through a second logic gate G2 to second latch "Latch 2". First and second logic gates G1 and G2 are AND gates and are operated as part of a demultiplexer in response to a selection signal SELi derived from a DMUX control signal such as that illustrated in FIG. 3A. Clock signal elk and selection signal SEL are input to a third logic gate G3, which provides an output signal to a delay circuit ΔT.

Output values of the first and second latches are stored in respective first and second flipflops FF1 and FF2 at a first time $t_1$ defined by clock signal elk and a delay imposed by delay circuit ΔT. If first and second flipflops FF1 and FF2 store the same value after time $t_1$, it indicates that neither of the first and second latches changed its value, which means that an updated value of the comparator output was not stored in the latches between t0 and t1, e.g. the comparison and storing was too slow and therefore we can conclude that the difference between the analog input signal and the reference voltage was relatively small. Consequently, the inspection of first and second flipflops FF1 and FF2 can be used to detect a metastability error in the ADC.

Subsequently, the outputs of first and second flipflops FF1 and FF2 are transferred to third through fifth flipflops FF3 through FF5 and sixth through eighth flipflops FF6 through FF8, respectively, at times defined by a final clock clk_final. The period of the final clock clk_final corresponds to the time required to perform "n+1" comparisons in ADC 500 for the "n+1" bits of digital output signal d[0:n]. Accordingly, clock signal elk passes through "n+1" cycles for each cycle of final clock clk_final. The data stored in first and second flipflops FF1 and FF2 is transferred in synchronization through the other flipflops until the transferred data reaches an XNOR gate.

Once the data reaches XNOR gate, if different values are stored in fifth and eighth flipflops FF5 and FF8, it indicates that no metastability error has occurred with respect to the data. Accordingly, a correction signal assumes the value "0" to indicate that no metastability error correction is required. Otherwise, if the same values are stored in fifth and eighth flip-flops FF5 and FF8, it indicates that a metastability error has occurred with respect to the data. Where a metastability error is present, the correction signal assumes the value "1" to indicate that metastability error correction is required. In general, the probability of failing to detect or correct a metastability error can be reduced arbitrarily by increasing the number of flipflops in each of the respective flipflop chains shown in FIG. 9.

In response to the correction signal assuming the value "1", metastability detection/correction unit 520 performs error correction by retaining all bit values of digital output signal d[0:n] that are more significant than the bit value where metastability occurred, and setting remaining bit values to a "1" followed by "0"s.

The conditions for detecting metastability, as described in relation to FIG. 9, can be formulated in an alternative manner, with certain generalizations, as follows. During each comparison, one output of comparator 505 is connected (through a demultiplexer) to the input of the first latch, and the other output of comparator 505 is connected (through the demultiplexer) to the input of the second latch. Before the comparison, comparator 505 is reset and the value of the latch is set to "1", although the use of "1" is just an example, and a different polarity can be used in other implementations. Where the latch is set to "1" before comparator 505 is strobed, the latch should be designed such that it does not allow false transitions at its output. After comparator 505 is strobed, three different scenarios may occur, depending on the difference between input signal $V_{in}$ and reference voltage $V_{ref}$, referred to hereafter as $V_{diff}$.

In a first scenario, $V_{diff}$ is relatively small, between −Vx and +Vx ($-Vx \leq V_{diff} \leq Vx$, Vx<LSB). Because $V_{diff}$ is relatively small, both outputs of comparator 505 stay at zero or produce only a narrow pulse at one of the comparator outputs. Whether there was no pulse at all or the pulse was narrow, this is not enough to change the value of the first and second latches by the first time the values of those latches are sampled using flip-flops. Therefore, at the first time a "1" is sampled from both the first and the second latches. This means metastability is detected.

In a second scenario, $V_{diff}$ is larger than Vx, (Vin>Vx, Vx<LSB). A wide pulse is produced at a plus output of comparator 505 and the first latch is reset to "0". Where the values of the latches are sampled at the first time, a "0" is obtained from the first latch and a "1" is obtained from the second latch, and no metastability is detected.

In a third scenario. $V_{diff}$ is smaller than −Vx (Vin<−Vx, Vx<LSB). This is similar to the second scenario, except the minus output of comparator 505 is activated and the second latch is reset. A "1" is obtained from the first latch and a "0" is obtained from the second latch and no metastability is detected.

As indicated by the description of the above three scenario, where $V_{diff}$ is such that $-LSB<-Vx \leq V_{diff} \leq Vx<LSB$, metastability is detected and a correction mechanism is activated.

Figure 10:
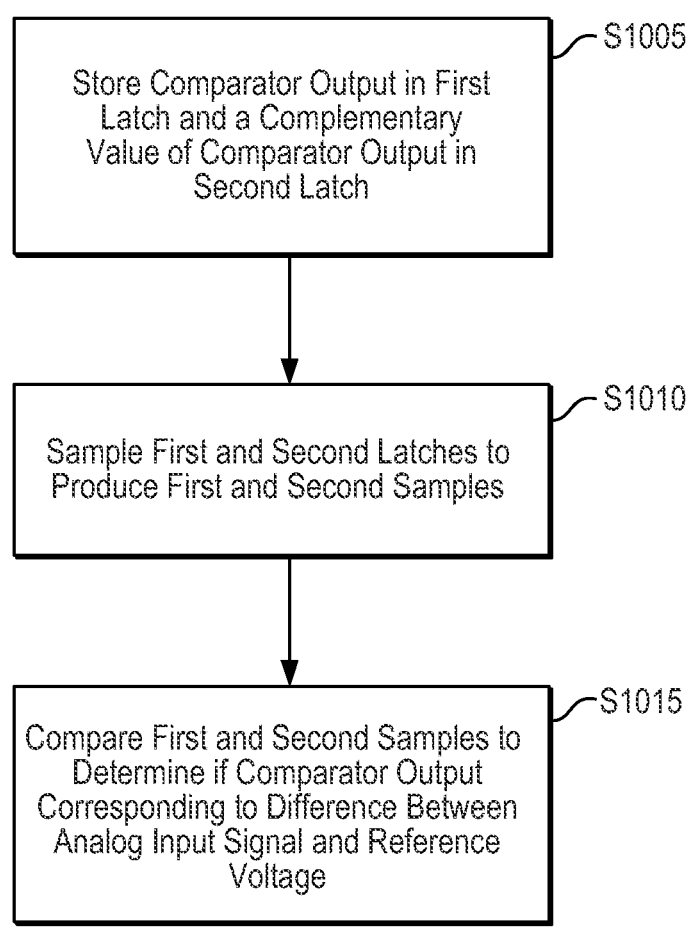
FIG. 10 is a flowchart illustrating a method of operating the ADC of FIG. 9 according to a representative embodiment.

FIG. 10 is a flowchart illustrating a method of operating the ADC of FIG. 9 according to a representative embodiment. As indicated by the labeling in FIG. 10, this method represents one possible implementation of operation 615 of FIG. 6.

Referring to FIG. 10, the method comprises storing the comparator output in a first latch and a complementary value of the comparator output in a second latch (S1005), sampling the first and second latches storing the comparator output to produce first and second samples (S1010), and then comparing the first and second samples to determine whether a comparator output corresponding to the difference between the analog input signal and the reference voltage was stored in the first and second latches before the first time $t_1$ (S1015). These operations can be performed by operation of the first and second latches, the flipflops, and the XNOR gate as illustrated in FIG. 9. Thereafter, a metastability error is detected upon determining that the first and second latches store the same value, indicating that a comparator output corresponding to the difference between the analog input signal and the reference voltage was not stored in the first and second latches before the first time $t_1$.

In the above embodiments, a metastability error is typically detected where the absolute value of a comparator input signal (e.g., a difference between $v_{in}$ and $v_{ref}$) is smaller than some value "m". Therefore, the comparator can produce three different output values: 1, 0 (or −1), and the metastable state. Effectively, this creates an additional quantization level. If the size of the metastable region is comparable to a least significant bit (LSB) size, this can be used to increase the resolution of the ADC, for example, to get n+1 bits of resolution with an n-bit ADC. A 1-bit resolution enhancement can be achieved, for instance, if _m=¼LSB. A metastability rate in this case is 50%.

As one example of this increased resolution, assume a 5-bit SAR ADC in which output bits are interpreted as 0 and 1 produces a result 10001, and metastability is detected at a second bit. Under these circumstances, a final output without resolution enhancement would be 11000.

With resolution enhancement it becomes 110001, by adding a 1 at the end of the result. As another example of this increased resolution, assume a 5-bit SAR ADC in which output bits are interpreted as −1 and +1 produces a result 01001, and metastability is detected at the third bit. Under these circumstances, a metastability flag is set to 1 and a result 01100 is sent. An overall result is interpreted as −1+1000.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of operating an analog to digital converter (ADC), comprising:
comparing an analog input signal to a reference signal, using a comparator, and generating a comparator output according to the comparison;
storing the comparator output in at least one memory unit;
monitoring the stored comparator output to determine whether a difference between the analog input signal and the reference signal is within a predetermined range; and detecting a metastability error upon determining that the difference between the analog input signal and the reference signal is within a predetermined range.

2. The method of claim 1, wherein monitoring the stored comparator output comprises:
   sampling the stored comparator output at a first time and a second time to generate respective first and second samples of the stored comparator output; and
   comparing the first and second samples to each other to determine whether the stored comparator output changed between the first time and the second time.

3. The method of claim 2, wherein the metastability error is detected upon determining that the first and second samples have different values.

4. The method of claim 2, wherein sampling the stored comparator output at the first time and the second time comprises:
   transferring the stored comparator output from the memory unit to a first flip-flop at the first time; and
   transferring the stored comparator output from the memory unit to a second flip-flop and from the first flip-flop to a third flip-flop, both at the second time;
   wherein the second time occurs at the end of a current ADC sampling period.

5. The method of claim 1, further comprising:
   (a) sampling the stored comparator output at an i-th time to produce an n-th sample, and storing the n-th sample in a p-th memory unit;
   (b) sampling the stored comparator output at a j-th time after the i-th time to produce an m-th sample, and storing the m-th sample in a q-th memory unit;
   (c) sampling the p-th memory unit to produce an (n+1)-th sample, and storing the (n+1)-th sample in a (p+1)-th memory unit;
   (d) sampling the q-th memory unit to produce an (m+1)-th sample, and storing the (m+1)-th sample in a (q+1)-th memory unit; and
   (e) comparing the (n+1)-th sample to the (m+1)-th sample and detecting the metastability error based on the comparison.

6. The method of claim 5, further comprising repeating (c) and (d) at least one time with increased values of m, n, p, and q in each repetition, prior to performing (e) with the increased values of m and n.

7. The method of claim 1, wherein storing the comparator output in at least one memory unit comprises storing the comparator output in a first memory unit and a complementary value of the comparator output in a second memory unit, and
   wherein monitoring the stored comparator output to determine whether a difference between the analog input signal and the reference signal is within the predetermined range comprises sampling the first and second memory units storing the comparator output to produce first and second samples, and comparing the first and second samples.

8. The method of claim 7, wherein the metastability error is detected upon determining that the first and second samples have the same value.

9. The method of claim 1, further comprising:
   (a) storing the comparator output as an n-th sample in a p-th memory unit and a complementary value of the comparator output as an m-th sample in an q-th memory unit;
   (b) sampling the p-th memory unit to produce an (n+1)-th sample, and storing the (n+1)-th sample in a (p+1)-th memory unit;
   (c) sampling the q-th memory unit to produce an (m+1)-th sample, and storing the (m+1)-th sample in a (q+1)-th memory unit; and
   (d) comparing the (n+1)-th sample to the (m+1)-th sample and detecting the metastability error based on the comparison.

10. The method of claim 9, further comprising repeating (b) and (c) at least one time with increased values of m, n, p, and q in each repetition, prior to performing (d) with the increased values of m and n.

11. The method of claim 1, further comprising, upon detecting the metastability error, generating a digital output signal representing the analog input signal, wherein the digital output signal comprises stored comparison results obtained before the metastability error was detected followed by multiple bits with values determined by the detection of the metastability.

12. The method of claim 11, wherein the multiple bits comprise a "1" followed by at least one trailing "0".

13. The method of claim 1, wherein the ADC is a synchronous successive approximation register (SAR) ADC.

14. The method of claim 1, wherein the memory unit is a latch.

15. An analog to digital converter (ADC), comprising:
   a comparator configured to compare an analog input signal to a reference signal to produce a comparator output;
   a storage unit comprising at least one memory unit configured to store the comparison result;
   a monitoring unit configured to monitor the stored comparator output to determine whether a difference between the analog input signal and the reference signal is within a predetermined range; and
   an error detection unit configured to detect a metastability error upon determining that the difference between the analog input signal and the reference signal is within a predetermined range.

16. The ADC of claim 15, wherein the monitoring unit monitors the stored comparator output by sampling the stored comparator output at a first time and a second time to generate respective first and second samples of the stored comparator output, and comparing the first and second samples to each other to determine whether the stored comparator output changed between the first time and the second time.

17. The ADC of claim 16, wherein the error detection unit detects the metastability error as a consequence of the monitoring unit determining that the first and second samples have different values.

18. The ADC of claim 15, wherein the storage unit stores the comparator output in a first memory unit and stores a complementary value of the comparison result in a second memory unit, and the monitoring unit samples the first and second memory units storing the comparator output to produce first and second samples, and compares the first and second samples.

19. The ADC of claim 18, wherein the error detection unit detects the metastability error as a consequence of the monitoring unit determining that the first and second samples have the same value.

20. The ADC of claim 15, further comprising a correction unit configured to correct the metastability error by generating a digital output signal representing the analog input signal, wherein the digital output signal comprises stored comparison results obtained before the metastability error was detected followed by multiple bits with values determined by the detection of the metastability.

* * * * *